(12) United States Patent
Hutton et al.

(10) Patent No.: US 8,943,676 B2
(45) Date of Patent: Feb. 3, 2015

(54) METHOD OF MANUFACTURING A SOLENOIDAL MAGNET STRUCTURE

(75) Inventors: Graham Hutton, Oxfordshire (GB); Jonathan Noys, Oxfordshire (GB); Adrian Mark Thomas, Oxfordshire (GB)

(73) Assignee: Siemens PLC., Frimley, Camberley (GB)

(*) Notice: Subject to any disclaimer, the term of this patent is extended or adjusted under 35 U.S.C. 154(b) by 522 days.

(21) Appl. No.: 12/832,675

(22) Filed: Jul. 8, 2010

(65) Prior Publication Data

US 2011/0012698 A1 Jan. 20, 2011

(30) Foreign Application Priority Data

Jul. 16, 2009 (GB) ................................... 0912367.0

(51) Int. Cl.
- *H01F 7/06* (2006.01)
- *G01R 33/381* (2006.01)
- *G01R 33/38* (2006.01)
- *H01F 6/06* (2006.01)
- *H01F 41/04* (2006.01)
- *H01F 41/12* (2006.01)

(52) U.S. Cl.
CPC .......... *G01R 33/381* (2013.01); *G01R 33/3802* (2013.01); *H01F 6/06* (2013.01); *H01F 41/048* (2013.01); *H01F 41/127* (2013.01)
USPC ................... 29/607; 29/599; 29/606; 29/846; 427/116; 427/123; 427/124; 335/216

(58) Field of Classification Search
USPC ........ 29/599, 602.1, 605, 606, 846, 847, 856, 29/858, 883; 427/96, 97, 116, 123, 124; 335/216; 438/3, 42, 57, 98
See application file for complete search history.

(56) References Cited

U.S. PATENT DOCUMENTS

| | | | |
|---|---|---|---|
| 4,268,810 A * | 5/1981 | Iwasa et al. | 336/205 |
| 5,489,848 A | 2/1996 | Furukawa | |
| 5,917,393 A | 6/1999 | Kupiszewski et al. | |
| 6,870,516 B2 | 3/2005 | Aisenbrey | |

(Continued)

FOREIGN PATENT DOCUMENTS

| | | |
|---|---|---|
| CN | 1538554 A | 10/2004 |
| CN | 1873846 A | 12/2006 |

(Continued)

OTHER PUBLICATIONS

UK Search Report dated Oct. 26, 2009 (Two (2) pages).

(Continued)

*Primary Examiner* — Paul D Kim
(74) *Attorney, Agent, or Firm* — Crowell & Moring LLP

(57) ABSTRACT

A method of manufacturing a solenoidal magnet structure, comprising the steps of providing a collapsible mold in which to wind coils; winding wire into defined positions (88) in the mold to form coils (34); placing a preformed tubular mechanical support structure (102, 120) over the coils (34) so wound; impregnating the coils and bonding them to the mechanical support structure by applying a thermosetting resin and allowing the thermosetting resin to harden; and collapsing the mold and removing the resultant solenoidal magnet structure comprising the resin impregnated coils and the mechanical support structure from the mold as a single solid piece.

30 Claims, 4 Drawing Sheets

(56) References Cited

U.S. PATENT DOCUMENTS

| | | | |
|---|---|---|---|
| 7,849,587 B2 * | 12/2010 | Calvert et al. ............... | 29/605 |
| 7,859,375 B2 | 12/2010 | Atkins et al. | |
| 2006/0138646 A1 * | 6/2006 | Aisenbrey ............... | 257/712 |
| 2006/0284711 A1 * | 12/2006 | Atkins et al. ............ | 335/216 |
| 2007/0247263 A1 | 10/2007 | Calvert et al. | |

FOREIGN PATENT DOCUMENTS

| CN | 101075497 A | 11/2007 |
|---|---|---|
| GB | 2 437 114 A | 10/2007 |
| GB | 2 446 974 A | 8/2008 |
| JP | 62-15803 A | 1/1987 |
| JP | 62-186503 A | 8/1987 |
| JP | 11-251133 A | 9/1999 |
| JP | 2004-273568 A | 9/2004 |
| JP | 2007-288193 A | 11/2007 |

OTHER PUBLICATIONS

Chinese Office Action dated Nov. 28, 2013 w/ English translation (twenty three (23) pages).
Japanese Office Action dated Apr. 1, 2014, including English translation (six (6) pages).

* cited by examiner

METHOD OF MANUFACTURING A SOLENOIDAL MAGNET STRUCTURE

The present invention relates to a method of manufacture of solenoidal magnet coils, and to solenoidal magnet coils themselves. In particular, it relates to such coils for generating high strength magnetic fields, which may be applied in systems such as nuclear magnetic resonance (NMR) or magnetic resonance imaging (MRI).

FIGS. 1A-1B illustrate cross-sectional and axial sectional views, respectively, of a conventional solenoidal magnet arrangement for a nuclear magnetic resonance (NMR) or magnetic resonance imaging (MRI) system. A number of coils 34 of superconducting wire are wound onto a former 1. The resulting assembly is housed inside a cryogen vessel 2 which is at least partly filled with a liquid cryogen 2a at its boiling point. The coils are thereby held at a temperature below their critical temperature.

The former 1 is typically constructed of aluminum, which is machined to ensure accurate dimensions of the former, in turn ensuring accurate size and position of the coils which are wound onto the former. Such accuracy is essential in ensuring the homogeneity and reliability of the resultant magnetic field. Superconducting magnets may quench due to even a small amount of movement of even one turn of the coil. The formers must therefore be very rigid. These requirements combine to render the production of formers very expensive.

Also illustrated in FIGS. 1A-1B are an outer vacuum container 4 and thermal shields 3. As is well known, these serve to thermally isolate the cryogen tank from the surrounding atmosphere. Insulation 5 may be placed inside the space between the outer vacuum container and the thermal shield. However, as can be seen in FIGS. 1A-1B, these elements also reduce the available inside diameter 4a of the solenoidal magnet. Since the available inside diameter 4a of the solenoidal magnet is required to be of a certain minimum dimension to allow patient access, the presence of the outer vacuum container 4 and the thermal shields 3 effectively increases the diameter of the magnet coils and the former 1, adding to the cost of the overall arrangement.

The cost of producing a former 1 such as illustrated in FIGS. 1A-1B and described above is accounted for approximately equally by labor costs and material costs. Among other objectives, the present invention seeks to reduce the labor costs involved in producing a solenoidal magnet structure.

U.S. Pat. No. 5,917,393 describes a superconducting magnet arrangement wherein superconducting wire is mounted on an inner or outer surface of a thermally conductive cylinder, whereby cooling may be applied through the material of the former. The superconducting wire is thermally connected to, but electrically isolated from, the material of the cylinder.

The present invention aims to alleviate at least some of the problems of the prior art, and provides a relatively inexpensive and lightweight solenoidal magnet structure which is capable of withstanding the forces applied to it in use, and provides accurate and stable positioning of the coils of the solenoidal magnet.

Accordingly, the present invention provides apparatus and methods as defined in the appended claims.

The above, and further, objects, characteristics and advantages of the present invention will become more apparent from consideration of the following description of certain embodiments thereof, given by way of examples only, in conjunction with the accompanying drawings, wherein.

The present invention particularly provides a method of manufacturing a solenoidal magnet structure. An embodiment of the present invention will now be discussed with reference to FIGS. 2-4D.

Figure 1A:
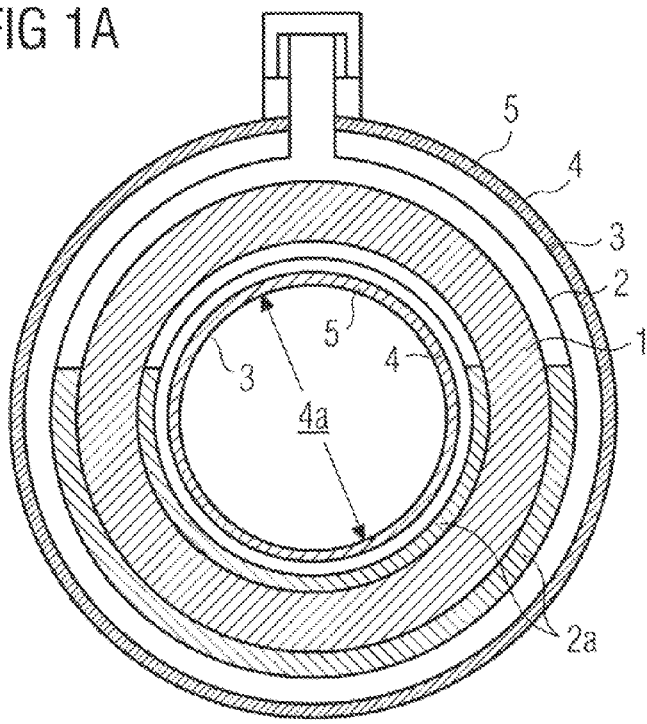
FIGS. 1A-1B show a solenoidal magnet structure housed within a cryostat, according to the prior art.
Figure 1B:
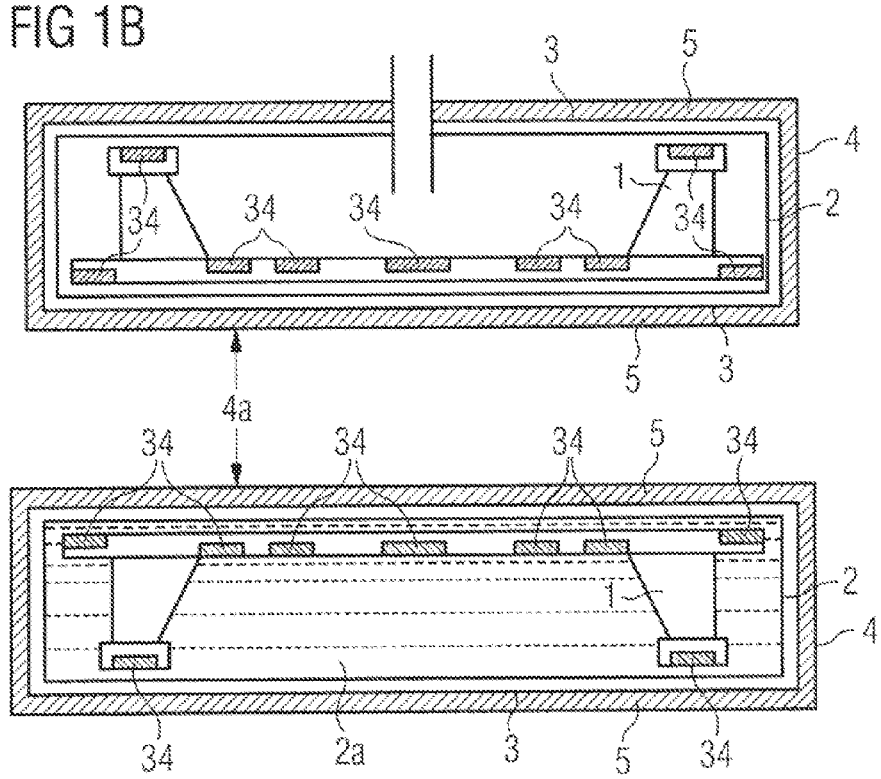
Figure 2:
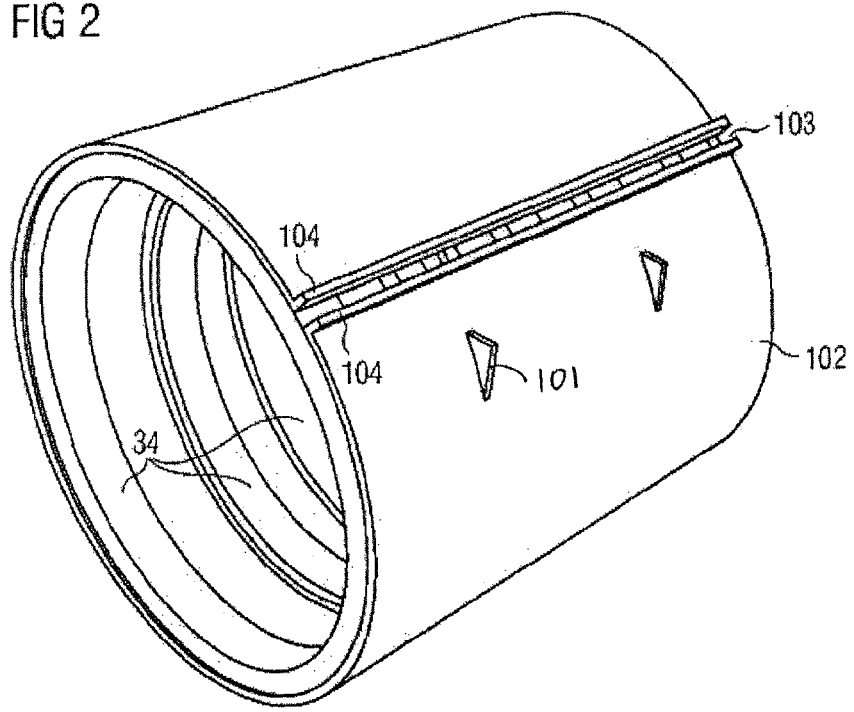
FIG. 2 shows an overall perspective view of an assembly of coils and a mechanical supporting structure according to an embodiment of the present invention.

FIG. 2 shows an overall perspective view of an assembly of coils 34 and a mechanical supporting structure 102 according to an embodiment of the present invention. The invention provides that the mechanical supporting structure 102 is a preformed cylinder, such as of a metal or a composite material, bonded to the radially outer surface of the coils. Typical example materials include aluminum, and fiberglass reinforced epoxy resin. Coils 34 are formed within a mold, the mechanical supporting structure 102 is slid over the outside of the coils, and the whole structure is then resin impregnated to bond the coils onto the support structure and produce a single solid piece which comprises the coils 34 and the mechanical support structure 102.

FIG. 2 shows an example of a cylindrical mechanical support structure 102 as used in the present invention. As shown, the structure 102 may have an axial split 103 along its length, bordered with retaining flanges 104. When assembling a magnet structure of the present invention, the axial split 103 may be opened, to increase the internal diameter of the support structure 102. The support structure may then be slid easily over the coils 34. Once in position, the retaining flanges 104 may be pulled together, for example using bolts, clamps, screws or any other suitable arrangement. This reduces the internal diameter of the support structure, and may cause the internal surface of the support structure to bear onto coils 34, retaining them in position.

Figure 2A:
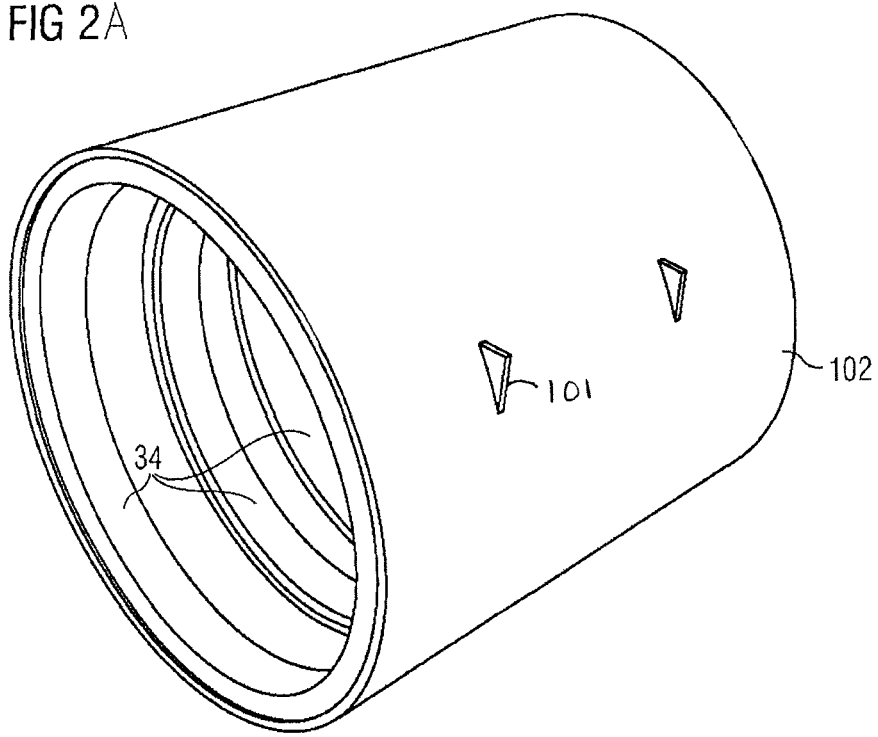
FIG. 2A shows an overall perspective view of an assembly of coils and a mechanical supporting structure according to another embodiment of the present invention.

In an alternative arrangement illustrated in FIG. 2A, the cylindrical mechanical support structure 102 is a complete cylinder. The internal diameter of the mechanical support is somewhat larger than the outer diameter of the coils 34. To install, the support structure 102 is slid over the coils 34, leaving a clearance between the outer surface of the coils and the inner surface of the mechanical support. This clearance is then filled with a filler, for example a granular filler such as sand or glass beads, before the impregnation step. During the impregnation step, resin fills the clearance, around the filler, impregnates the coil windings and causes the coils to adhere to the inner surface of the cylindrical mechanical support.

In both examples, as shown in FIG. 2 and FIG. 2A, mechanical support structures such as shown at 101 may be provided on the external surface of the support structure, for use in mounting the magnet structure—for example within a cryogen vessel or vacuum vessel.

Figure 3:
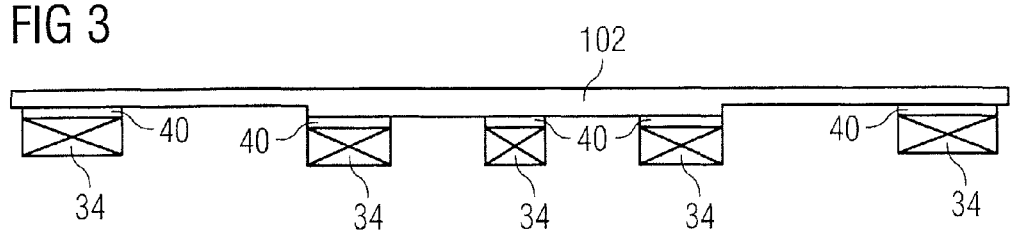
FIG. 3 shows an axial half-cross-section through an assembly of coils and a mechanical supporting structure according to an embodiment of the present invention.

FIG. 3 illustrates an axial half-cross-section through an assembly of coils and a mechanical supporting structure according to an embodiment of the present invention. An advantage of the arrangement of the present invention is that the frictional interface between the radially inner surface of the coils and former is eliminated. This frictional interface may provoke quench in prior art arrangements, since movement of a coil in frictional contact with a former may cause sufficient localized heating to bring about a quench. The radially inner surface of a superconducting coil is the part most susceptible to quench, so it is particularly useful to eliminate frictional heating in that region. Since there are no such frictional interfaces in the arrangement of the present invention, such risks are not present. The coils are separated from the mechanical support structure by filler layers 40, which also serve as thermal diffusion barriers, as will be explained below. The body force, that is the axial electromagnetic force acting on the coils, is restrained by the shear bond strength between the coils 34 and the mechanical support structure 120. The interfacial shear strength required between the coils 34 and the mechanical support structure 102 to maintain their position when subjected to the electromagnetic loads is within the capability of existing technology of bonding methods described herein.

In some conventional arrangements, slip planes were provided. These are interface surfaces along which the coils can move relatively easily over a former. Rather than trying to prevent movement, their aim is to make any movement as frictionless as possible to reduce the frictional heat produced by any such movement. In the present invention, the coils are firmly attached to the mechanical support structure, and there is no need to provide slip planes.

As illustrated in FIG. 3, a thermal diffusion barrier 40 may be provided between the coils and the mechanical support structure. This thermal diffusion barrier 40 should be electrically insulating, magnetically inert and thermally conductive. The thermal diffusion barrier may be a layer of wire wound over the superconducting coil. The thermal diffusion barrier serves to spread heat, to prevent heat from the former reaching the coil, or at least to spread any heat from the former over a larger surface of the coil, to prevent hot spots. The thermal diffusion barrier may also serve to bring the outer diameter of certain coils 34 to nearer the inner diameter of the mechanical support structure. The thermal diffusion barrier may, as described further below, include a composite material such as fiberglass reinforced epoxy resin.

Figure 3A:
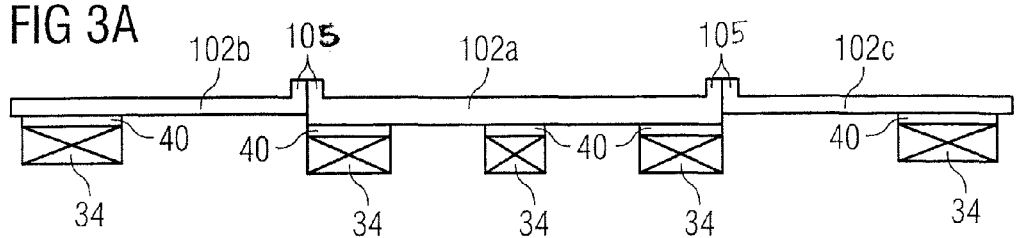
Figure 3B:
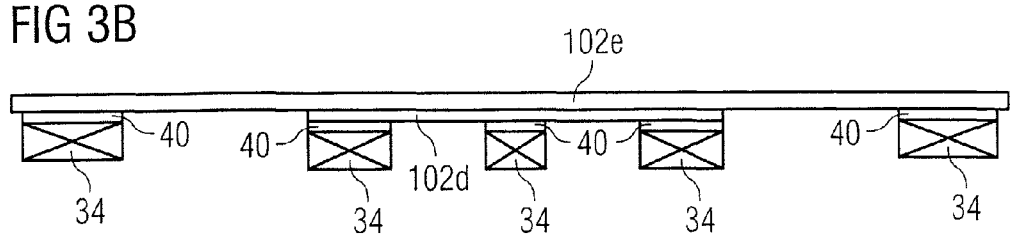

In the arrangement of FIG. 3, the three axially inner coils have a smaller outer diameter than the axially outer coils. This is believed to be typical of current superconducting magnets for MRI imaging systems. Evidently, the support structure 102 cannot be slid over the axially outer coils, as it has an internal diameter less than the external diameter of the axially outer coils. The support structure may be split axially, as shown in FIG. 2, the cut 103 opened until the support 102 can pass over the radially outer coils, then be clamped back together once aligned with the coils 34. One alternative method for constructing such an arrangement, according to the present invention, is illustrated in FIG. 3A. The magnet assembly is constructed in three parts. A first, central, mechanical support structure 102a is assembled to the axially inner coils of reduced internal diameter. Second and third, outer, mechanical supports 102b, 102c are then assembled to respective axially outer coils. The three parts of the mechanical support structure may then be assembled together, and the whole assembly impregnated. Radial flanges 105 may be used to join the parts together. Flanges 105 may be joined using bolts, clamps, screws or any other suitable arrangement. In an alternate method, illustrated in FIG. 3B, a first, smaller diameter, mechanical support structure 102d is assembled to the axially inner coils of reduced internal diameter. A second, larger diameter, mechanical support structure 102e is then slid over the first mechanical support 102d and the axially outer coils. The resulting assembly is then impregnated. It may be preferred that the second, larger diameter, mechanical support structure is axially split, as shown in FIG. 2. This will allow an increase in the internal diameter of the mechanical support structure to allow it to slide easily over the first, smaller diameter, mechanical support structure. The split 103 may then be closed, as discussed with reference to FIG. 2.

Figure 3C:
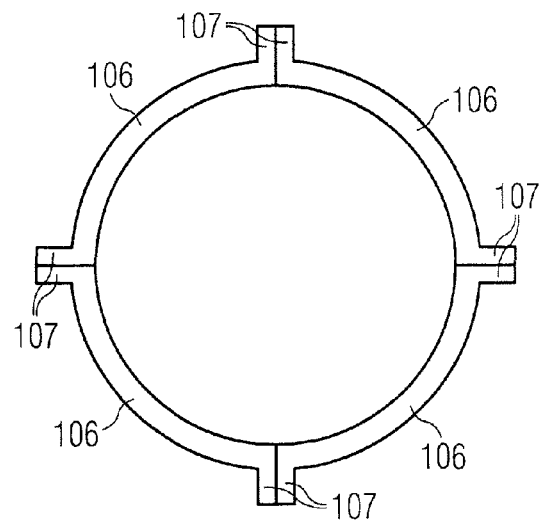

Another alternative arrangement for forming the mechanical support structure is schematically illustrated in radial cross-section in FIG. 3C. A plurality of sections 106, each of arcuate cross-section, are assembled together to create a cylindrical support structure. They may be assembled using axial flanges 107 running along the edges of each section. As the flanges 104 of FIG. 2, the flanges 107 may be joined together using bolts, clamps, screws or any other suitable arrangement.

Patient comfort and accessibility of clinicians in MRI systems may both be improved by reducing the length of the magnet. Coil arrangements which permit this length reduction, while maintaining field quality may result in coil body forces which act in an axial direction away from the centre of the magnet. Conventional methods of restraining these forces require additional former material to be positioned on the end of the coil, which increases the length of the magnet system. By utilizing the shear strength at the interface between the coils and the mechanical support structure, such additional material can be avoided and a shorter magnet system length achieved in embodiments of the present invention.

A method of producing a magnet structure according to the present invention will now be described. Firstly, an accurate mold is required in which to wind the coils. As no former is to be provided, the accurate dimensions and relative spacing of the coils are defined by this mold, which must accordingly be very accurately made, and of a durable material, to allow a single mold to be used to produce many magnet structures. The mold is arranged to be collapsible. Superconducting wire is wound into defined positions in the mold. Typically, these positions will be recesses in the surface of the mold. A mechanical support structure 102, such as a tube of metal such as aluminum or stainless steel; or of a composite material such as fiberglass reinforced plastic, is placed over the coils 34 so wound. A layer of fiberglass cloth may be placed over the outer circumference of the coils before the mechanical support structure 102 is positioned. The layer of fiberglass cloth will provide thermal diffusion barrier 40. A further mold may be placed over the coils 34 and the mechanical support structure 102 to form an enclosed mold cavity. The coils and the mechanical support structure within the mold are monolithically impregnated with a thermosetting resin. This is allowed to harden and the resin impregnated coils and the mechanical support structure, now bonded to the coils, is removed from the mold as a single solid piece. The impregnation step is preferably performed in a vacuum, to avoid bubbles of air or other gas which might otherwise be trapped in the coil windings and cause stresses in the finished piece. The mold may be provided with a lining, such as of polytetrafluoroethylene PTFE, to aid in releasing finished articles.

A particular advantage of this method of forming the solenoidal coil arrangement is in that the coils are accurately dimensioned and positioned relative to each other by the shape of the mold. The mechanical support structure which is bonded onto the coils does not need to be accurately dimensioned, since the positioning of the coils is defined by the mold, and the mechanical support structure merely serves to securely retain the coils in their relative positions as defined by the mold.

This is particularly advantageous since the mold, which must be very accurately dimensioned, and is relatively expensive, may be re-used several times to produce a number of similar solenoidal magnet structures. Hitherto, the former has been the accurately dimensioned, expensive component, and of course can only be used for one magnet structure. Use of the method of the present invention, using an accurately machined mold to define the dimensions and relative positions of the coils, accordingly allows production of accurate solenoidal magnet structures for a reduced cost, and in reduced time, as compared to existing methods of production.

According to an aspect of the present invention, a preformed, tubular mechanical support structure 102 is positioned over the coils 34 in a mold prior to the impregnation step when thermosetting resin is applied to monolithically embed the coils and bond them to the mechanical support structure to produce a single solid article. Typically vacuum impregnation is used. The coils 34 may be over-wound with cloth 40 to bring their outer diameters to the same size as the inner diameter of the mechanical support structure, and to provide a thermal diffusion barrier layer. The cloth will be impregnated with the thermosetting resin during the molding step. Again, the moulds may be provided with a lining, such as of polytetrafluoroethylene PTFE, to aid in releasing the finished articles.

In some alternative embodiments, a wet lay-up process may be employed, where the resin is applied as a coating on the coil conductor, and as part of the mechanical support structure, either as a coating on the mechanical support structure or as an impregnated cloth at layer 40 or similar material.

The mechanical support structure 102 may be manufactured as an aluminum extrusion, or formed as rolled and welded tubes of stainless steel; it may be formed as a filament wound tube of fiberglass reinforced plastic, or may be molded from suitable materials. It may comprise one or more layers of wire wound into a cylinder and embedded in a thermoset material.

Typically in solenoidal magnet structures, some coils will be of different internal or external diameter from others. In this case, it may be necessary to bring all coils to a common diameter to enable them all to be attached to a mechanical support structure of constant internal diameter. Differences in the relevant diameters of the coils may be corrected by use of a filler layer 40 of resin-impregnated cloth overwrap, typically employing glass fiber cloth. This may be added while the coil is in a mold, and may be added either as resin impregnated cloth or as a dry cloth to be impregnated in the mold.

The coils 34 are wound within corresponding parts of the mold, according to the method described above. In the mold, a filler material 40 such as resin impregnated glass fiber may be wound over coils in order to fill the mold to the top. For example, such filler material may be provided to a depth of 5-10 mm. The mold may comprise a collapsible mandrel having at least one removable section, allowing the mold to be disassembled and removed from the interior of the molded coils 20.

The use of relatively inaccurate mechanical support structure 102 for the coils, being a preformed tube, typically of metal or composite material, and molded resin is rendered possible by use of accurate tooling. All of the important relative positions of features of the solenoidal structure are defined by the mold or other assembly tooling, resulting in a relatively low unit cost of the solenoidal magnet arrangements produced, while the relatively expensive mold and tooling may be re-used a number of times to produce several solenoidal magnet coil assemblies.

The final structure may be further strengthened to prevent any significant deformation.

Figure 4A:
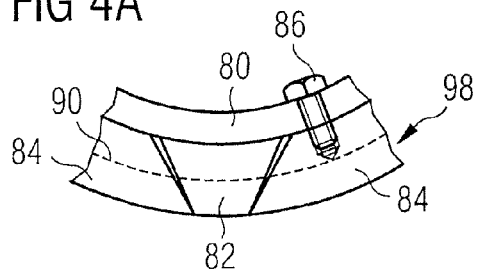
FIGS. 4A-4D show steps in a method for producing an assembly of coils and a mechanical supporting structure according to an embodiment of the present invention.
Figure 4B:
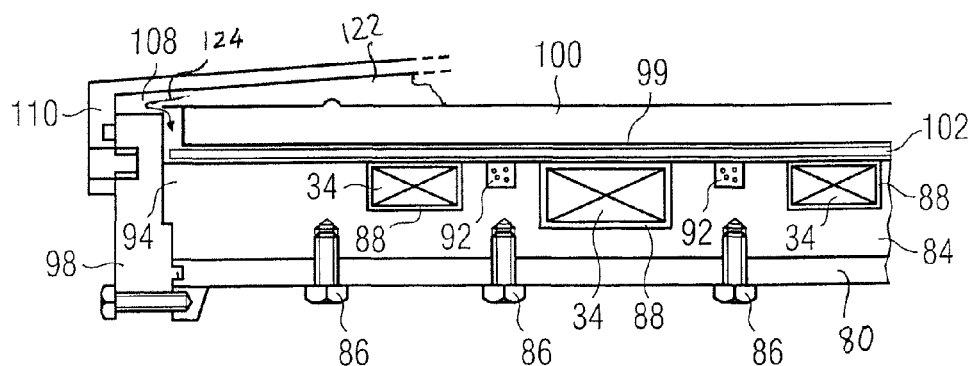

FIGS. 4A-4D illustrate several views of steps in a method of manufacturing a solenoidal magnet structure according to the present invention, in part axial half cross section. In this example, the mechanical support structure consists of an aluminum tube 102. FIGS. 4A and 4B show a partial end-view and a partial axial cross-section, respectively, of a collapsible mold 80, 82, 84 into which coils 34 have been wound in predefined positions 88, during the manufacture of a solenoidal magnet coil assembly according to the present invention, with an aluminum tube mechanical support structure 102. The collapsible mold includes an inner cylinder member 80 which retains tool segments 82, 84. The tube 80 may be a single complete cylindrical tube, or may be divided into segments. The tube 80 may be a collapsible mandrel having at least one removable section. In use, the cylinder 80 and tool segments 82, 84 are retained together by detachable mechanical retaining means, such as the bolts 86 illustrated, to form a generally cylindrical inner surface of the mold.

As shown in FIG. 4B, the tool segments 82, 84 have cavities 88 for retaining coils 34 as they are wound onto the mold, and cavities 92 for retaining electrical leads and other service components.

As illustrated in FIG. 4B, over the top of coils 34 and leads and service components 92, a pre-formed tube 102 of composite material, or of metal, or of other suitable material, is slid over the coils from one end of the mold. A mold outer 100 is provided to surround the tool segments and the pre-formed tube 102, and to define mold cavity 99 with the tool segments 82, 84 and end pieces 98, if any. While the tool segments 82, 84 must be accurately formed and accurately positioned, it is not necessary to apply such a degree of accuracy to the position and shape of the mold outer 100.

The mold cavity 99 is open in certain locations 108, e.g. at its ends. Openings may also be provided through the mold outer 100. An impregnation trough 110 is affixed around the mold structure, and a thermosetting impregnation resin 122 is forced 124 through the openings 108 from the impregnation trough into the mold. The resin 122 monolithically impregnates the coils 34, leads and service components 92, and any filler material layers 40, 114, and to bond the coils to the preformed cylindrical mechanical support structure 102 and produce a single solid article, being the solenoidal magnet structure comprising coils and the preformed cylindrical mechanical support structure.

Once the assembly has been fully impregnated and the resin has set, the various pieces of the mold 82, 84, 98, 100 are moved away from the resultant single solid article, the molded structure. Firstly, the impregnation trough 110 and end pieces 98 should be removed from the mold. The mold outer 100 may also be removed at this stage, or may be removed later. Typically, and with reference to FIGS. 4A, 4B, cylinder 80 is detached from the tool segments. If the cylinder 80 is in a single piece, it can be slid out from the central bore of the assembly. If the cylinder 80 is split into segments, these segments may be dismantled and removed from the bore of the molded structure. The tool segments 82, 84 are then removed from the molded article. In the example shown in FIG. 4A, the tool segment 82 is tapered to narrow away from the bore of the mold. Such segments should be removed first, to provide clearance for removal of the remaining tool segments 84.

Figure 4C:
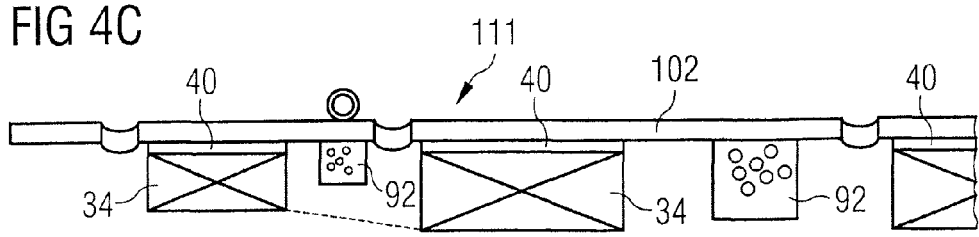

FIG. 4C shows an example of a solenoidal coil assembly 111 produced according to the method described above. The coils 34 are impregnated with resin and have dimensions defined by the accurate surfaces of the tool segments 82, 84. They are bonded by the impregnated resin to the preformed cylindrical mechanical support structure 102. The shear strength of the mechanical bond between coils and the mechanical support structure provided by the resin impregnant is equally effective in both directions. The coils are accordingly rigidly held in accurate relative positions by the mechanical support structure.

As shown in FIG. 4C, holes may be provided through the mechanical support structure, for example to allow access to the coils 34 for electrical cables, to assist with circulation of coolant, to provide for mechanical retention of the structure within a cryostat, and so on. The holes may be formed by drilling or cutting after the impregnation step, or the mold may be provided with corresponding features to ensure that the holes remain open.

Figure 4D:
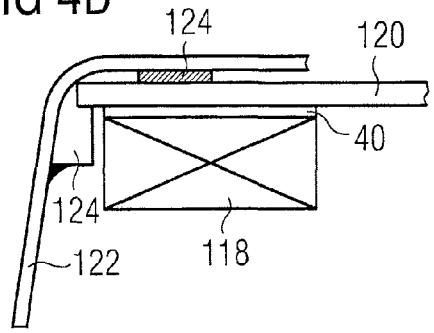

FIG. 4D shows a partial cross-section of a shield coil arrangement according to an embodiment of the present invention. A shield coil 118 is impregnated with resin, and bonded by that resin to a mechanical support structure 120, being a pre-formed cylinder of a composite material such as fiberglass-reinforced plastic, or of a metal such as aluminum or stainless steel, or other suitable material. The structure is shown mounted inside a vessel 122, for example a cryogen vessel, provided with locating means 124.

United Kingdom patent application GB2437114 describes methods of manufacturing solenoidal magnets, and solenoidal magnets so made, which bear some resemblance to certain embodiments of the present invention. However, significant differences of the present invention as compared to this prior art include the following. The preformed cylinders used for the mechanical support structure in the present invention may be produced in a "parallel" process. For example, a stock of preformed cylindrical mechanical support structures may be kept, avoiding the risk that a poorly formed cylindrical mechanical support structure would result in a scrap or reworked magnet, as may be the case with the methods of GB2437114. Any defective cylindrical mechanical support structures would be rejected before use, and so could not result in a reject solenoidal magnet structure. Each preformed cylindrical mechanical support structure may be tested before use to make sure that they meet the requirements of the design before being bonded to magnetic coils. The cylindrical mechanical support structures could be bought from a third party supplier, simplifying the manufacturing process for the magnet manufacturer. The cylindrical mechanical support structures themselves need not be particularly accurately formed, and so may be produced at relatively low cost.

The use of metal cylindrical mechanical support structures provides further advantages, for example that they are recyclable while composite materials are generally not recyclable; they have a relatively high thermal conductivity, which may allow cooling of the coils through or around the mechanical support structure; they have a relatively high electrical conductivity. Such conductive mechanical support structure will support eddy currents. The eddy currents are dependent on the rate of change of the magnetic field during quenching, ramping and imaging in an imaging system such as a magnetic resonance imaging (MRI) system. Control of the conductivity of the mechanical support structure may be used during the design process to alter stray field bursts during quench events; and can be used to control the rate of temperature increase during a quench, which would affect the pressure within a cryogen vessel containing the magnet. The mechanical support structure should also be stiff and strong. A composite material may be found to provide greater strength and/or stiffness per unit volume, or weight, than a metal, when used for the mechanical support structure of the present invention.

The invention claimed is:

1. A method of manufacturing a solenoidal magnet structure, comprising the steps of:

providing a preformed tubular mechanical support structure;

providing a collapsible mold in which to wind coils;

winding wire into defined positions in the mold to form the coils;

placing the preformed tubular mechanical support structure over the coils so wound, wherein the preformed tubular mechanical support structure has an inner diameter greater than an outer diameter of some of the coils;

impregnating the coils and bonding the coils to the mechanical support structure by applying a thermosetting resin and allowing the thermosetting resin to harden; and collapsing the mold and removing the resultant solenoidal magnet structure comprising the resin impregnated coils and the mechanical support structure from the mold as a single solid piece, wherein the preformed tubular mechanical support structure carries an axial split and the step of placing the tubular mechanical support structure over the coils comprises passing the mechanical support structure over the coils with the split open, then at least partially closing the split to reduce the internal diameter of the tubular mechanical support structure, to more closely approximate the outer diameter of the coils.

2. The method according to claim 1, wherein the internal diameter of the tubular mechanical support structure is reduced such that the tubular mechanical support structure grips the outer diameter of the coils.

3. The method according to claim 1, wherein the mold comprises a collapsible mandrel having at least one removable section, allowing the mold to be disassembled and removed from the interior of the solenoidal magnet structure.

4. The method according to claim 1, wherein cavities are provided in the mold for retaining electrical leads and other service components.

5. The method according to claim 1, wherein the defined positions are recesses in the surface of the mold.

6. The method according to claim 1, wherein the wire is a superconducting wire.

7. The method according to claim 1, wherein a mold outer is placed over the coils and the mechanical support structure to form an enclosed mold cavity, which is filled with thermosetting resin during the impregnating step.

8. The method according to claim 1, wherein the impregnating step is performed in a vacuum.

9. The method according to claim 1, wherein the mold is provided with a lining for aiding the release of the solenoidal magnet structure from the mold.

10. The method according to claim 1, wherein the impregnation step is performed by a wet lay-up process, wherein the thermosetting resin is applied as a coating on the wire, and on the mechanical support structure, either as a coating on the mechanical support structure or as an impregnated cloth or similar material.

11. The method according to claim 1, wherein the tubular mechanical support structure consists predominantly of a metal.

12. The method according to claim 1, wherein the tubular mechanical support structure consists predominantly of a composite material.

13. The method according to claim 1, wherein some coils are of different outer diameter from others, and differences in the outer diameters of the coils are compensated by use of a filler layer positioned between a radially outer surface of the coil and the radially inner surface of the tubular mechanical support structure.

14. The method according to claim 13 wherein the filler layer comprises a layer of resin-impregnated cloth.

15. The method according to claim 14 wherein the resin-impregnated cloth is added while the coils are in the mold, being added either as resin-impregnated cloth or dry cloth to be impregnated while in the mold.

16. A method of manufacturing a solenoidal magnet structure, comprising the steps of:
providing a collapsible mold in which to wind coils;
winding wire into defined positions in the mold to form the coils;
placing a preformed tubular mechanical support structure over the coils so wound, wherein the preformed tubular mechanical support structure has an inner diameter greater than an outer diameter of some of the coils;
impregnating the coils and bonding the coils to the mechanical support structure by applying a thermosetting resin and allowing the thermosetting resin to harden; and
collapsing the mold and removing the resultant solenoidal magnet structure comprising the resin impregnated coils and the mechanical support structure from the mold as a single solid piece, wherein the support structure is preformed by assembly of a plurality of sections, each of arcuate radial cross-section,
wherein axially inner coils are of different outer diameter from axially outer coils, and separate mechanical support structures are provided for the axially inner coils and the axially outer coils.

17. The method according to claim 16, wherein an axially inner mechanical support structure supports axially inner coils, and axially outer mechanical support structures support the axially outer coils, the axially inner and axially outer support structures being assembled together prior to the impregnation step.

18. The method according to claim 16, wherein a first mechanical support structure, of a first internal diameter, supports axially inner coils, and a second mechanical support structure, of a second internal diameter greater than the first internal diameter, supports the axially outer coils,
the first and second mechanical support structures being assembled together prior to the impregnation step.

19. The method according to claim 16, wherein the mold comprises a collapsible mandrel having at least one removable section, allowing the mold to be disassembled and removed from the interior of the solenoidal magnet structure.

20. The method according to claim 16, wherein cavities are provided in the mold for retaining electrical leads and other service components.

21. The method according to claim 16, wherein the defined positions are recesses in the surface of the mold.

22. The method according to claim 16, wherein the wire is a superconducting wire.

23. The method according to claim 16, wherein a mold outer is placed over the coils and the mechanical support structure to form an enclosed mold cavity, which is filled with thermosetting resin during the impregnating step.

24. The method according to claim 16, wherein the impregnating step is performed in a vacuum.

25. The method according to claim 16, wherein the mold is provided with a lining for aiding the release of the solenoidal magnet structure from the mold.

26. The method according to claim 16, wherein the impregnation step is performed by a wet lay-up process, wherein the thermosetting resin is applied as a coating on the wire, and on the mechanical support structure, either as a coating on the mechanical support structure or as an impregnated cloth or similar material.

27. The method according to claim 16, wherein some coils are of different outer diameter from others, and differences in the outer diameters of the coils are compensated by use of a filler layer positioned between a radially outer surface of the coil and the radially inner surface of the tubular mechanical support structure, wherein the filler layer comprises a layer of resin-impregnated cloth, wherein the resin-impregnated cloth is added while the coils are in the mold, being added either as resin-impregnated cloth or dry cloth to be impregnated while in the mold.

28. A method of manufacturing a solenoidal magnet structure, comprising the steps of:
providing a preformed tubular mechanical support structure;
providing a collapsible mold in which to wind coils;
winding wire into defined positions in the mold to form the coils;
placing the preformed tubular mechanical support structure over the coils so wound, wherein the preformed tubular mechanical support structure has an inner diameter greater than an outer diameter of some of the coils;
impregnating the coils and bonding the coils to the mechanical support structure by applying a thermosetting resin and allowing the thermosetting resin to harden; and
collapsing the mold and removing the resultant solenoidal magnet structure comprising the resin impregnated coils and the mechanical support structure from the mold as a single solid piece,
wherein axially inner coils are of different outer diameter from axially outer coils, and separate mechanical support structures are provided for the axially inner coils and the axially outer coils.

29. The method according to claim 28, wherein an axially inner mechanical support structure supports axially inner coils, and axially outer mechanical support structures support the axially outer coils, the axially inner and axially outer support structures being assembled together prior to the impregnation step.

30. The method according to claim 28, wherein a first mechanical support structure, of a first internal diameter, supports axially inner coils, and a second mechanical support structure, of a second internal diameter greater than the first internal diameter, supports the axially outer coils,
the first and second mechanical support structures being assembled together prior to the impregnation step.

* * * * *